US007577195B2

(12) United States Patent
Hickey, Jr.

(10) Patent No.: US 7,577,195 B2
(45) Date of Patent: Aug. 18, 2009

(54) METHOD FOR DETERMINING THE LIKELIHOOD OF A MATCH BETWEEN SOURCE DATA AND REFERENCE DATA

(75) Inventor: Richard J. Hickey, Jr., Yorktown Heights, NY (US)

(73) Assignee: Clear Channel Management Services, Inc., San Antonio, TX (US)

( * ) Notice: Subject to any disclaimer, the term of this patent is extended or adjusted under 35 U.S.C. 154(b) by 0 days.

(21) Appl. No.: 12/113,856

(22) Filed: May 1, 2008

(65) Prior Publication Data

US 2008/0198919 A1    Aug. 21, 2008

Related U.S. Application Data

(62) Division of application No. 10/643,729, filed on Aug. 19, 2003, now Pat. No. 7,386,047.

(51) Int. Cl.
*H04B 1/66* (2006.01)
(52) U.S. Cl. .................................................. 375/240
(58) Field of Classification Search ................ 375/240, 375/241; 725/22; 702/19
See application file for complete search history.

(56) References Cited

U.S. PATENT DOCUMENTS

| 5,019,899 | A | 5/1991 | Boles et al. |
| 5,437,050 | A | 7/1995 | Lamb et al. |
| 5,621,454 | A | 4/1997 | Ellis et al. |
| 7,386,047 | B2 | 6/2008 | Hickey, Jr. |
| 2003/0086400 | A1* | 5/2003 | Wakamatsu ............... 370/337 |
| 2005/0043893 | A1 | 2/2005 | Hickey, Jr. |

OTHER PUBLICATIONS

IEEE 100, "The Authoritative Dictionary of IEEE Standards Terms" Seventh Edition, IEEE Press Publication, 2000, p. 513.

* cited by examiner

*Primary Examiner*—Khai Tran
(74) *Attorney, Agent, or Firm*—Andrews Kurth LLP (57) ABSTRACT

A method for reducing data in the form of successive groups of N values may comprise finding the largest X values of the N values of each group, setting all but the largest X values of each group equal to zero, averaging W respective ones of the N values to produce N average values, finding the largest Y of the N average values, where Y is less than X, and setting the largest Y of the N average values equal to a first binary value, and a reminder of the N average values equal to a second binary value.

53 Claims, 6 Drawing Sheets

FIG. 1

| Frame 1 | Frame 2 | Frame 3 | Frame 4 | Frame 5 |
|---|---|---|---|---|
| .06 | .12 | .2 | .01 | .02 |
| .2 | .19 | .05 | .3 | .001 |
| .04 | .05 | .07 | .05 | .04 |
| .3 | .01 | .2 | .1 | .01 |
| .001 | .02 | .03 | .01 | .2 |
| .056 | .1 | .16 | .12 | .08 |

FIG. 2A

| Frame 1 | Frame 2 | Frame 3 | Frame 4 | Frame 5 |
|---|---|---|---|---|
| 0 | .12 | .2 | 0 | 0 |
| .2 | .19 | 0 | .3 | 0 |
| 0 | 0 | 0 | 0 | 0 |
| .3 | 0 | .2 | .0 | 0 |
| 0 | 0 | 0 | 0 | .2 |
| 0 | 0 | 0 | .12 | .08 |

FIG. 2B

| Frame 1 | Frame 2 | Frame 3 | Frame 4 | Frame 5 | Average | Output |
|---|---|---|---|---|---|---|
| 0 | .12 | .2 | 0 | 0 | .064 | 1 |
| .2 | .19 | 0 | .3 | 0 | .138 | 1 |
| 0 | 0 | 0 | 0 | 0 | 0 | 0 |
| .3 | 0 | .2 | .0 | 0 | .1 | 1 |
| 0 | 0 | 0 | 0 | .2 | .04 | 0 |
| 0 | 0 | 0 | .12 | .08 | .04 | 0 |

METHOD FOR DETERMINING THE LIKELIHOOD OF A MATCH BETWEEN SOURCE DATA AND REFERENCE DATA

CROSS REFERENCE TO RELATED APPLICATIONS

This application is a divisional of U.S. patent application Ser. No. 10/643,729, filed on Aug. 19, 2003 now U.S. Pat. No. 7,386,047, the disclosure of which is incorporated herein by reference.

FIELD

The present invention relates to methods, apparatus and articles used for the analysis of data. More particularly, it relates to methods, apparatus and articles used to reduce large amounts of data to much smaller forms. More particularly still, it relates to methods, apparatus and articles which may be used to reduce the data to a form conducive to efficient analysis of the data.

BACKGROUND

There are many instances in which a great deal of data is produced, and it is a lengthy and costly process to analyze the data. By way of example only, and not by way of limitation, in the broadcast industry, it is desirable to monitor the programs broadcast by stations to determine whether specific content, such as, for example, music or songs, has been broadcast.

An example of how this may be accomplished is disclosed in U.S. Pat. No. 5,437,050, entitled Method and Apparatus for Recognizing Broadcast Information Using Multi-Frequency Magnitude Detection, issued to Lamb et al. and assigned to the same assignee as that of the present invention.

As noted in this patent, a wide variety of copyrighted recordings and commercial messages are transmitted by broadcast stations. Copyrighted works such as motion pictures, television programs, and phonographic recordings attract audiences for broadcast stations, and the aforementioned commercial messages, when sent to the audiences, provide revenue for the broadcast stations.

There is an interest among various unions, guilds, performance rights societies, copyright owners, and advertising communities in knowing the type and frequency of information being broadcast. Owners of copyrighted works, for example, may be paid a royalty rate by broadcast stations depending on how often their copyrighted work is broadcast. Similarly, commercial message owners such as advertisers, who pay broadcast stations for air time, have an interest in knowing how often their commercial messages are broadcast.

It is known in the art that commercial radio and television broadcast stations are regularly monitored to determine the number of times certain information is broadcast. Various monitoring systems have been proposed in the prior art. In manual systems, which entail either real-time listening or delayed listening via video or audio tapes, people are hired to listen to broadcast information and report on the information they hear. Manual systems, although simple, are expensive, lack reliability, and are very often highly inaccurate.

Electronic monitoring methodologies offer advantages over manual systems such as lower operating costs and reliability. One type of electronic monitoring methodology requires insertion of specific codes into broadcast information before the information is transmitted. The electronic monitoring system can then recognize a song, for example, by matching the received code with a code in a reference library. Such systems suffer from both technical and legal difficulties. For example, such a coding technique requires circuitry, which is expensive to design and assemble and which must be placed at each transmitting and receiving station. Legal difficulties stem from the adverse position of government regulatory agencies toward the alteration of broadcast signals without widespread acceptance thereof by those in the broadcast industry.

A second type of electronic monitoring methodology requires pre-specification of broadcast information into a reference library of the electronic monitoring system before the information can be recognized. A variety of pre-specification methodologies have been proposed in the prior art. The methodologies vary in speed, complexity, and accuracy. Methodologies which provide accuracy are likely to be slow and complex, and methodologies which provide speed are likely to be inaccurate.

The apparatus and method described in the above mentioned U.S. Pat. No. 5,437,050 have met with commercial success and have in large part met the needs of many segments of the broadcast industry. This approach is based on the discovery that the broadcast information on which recognition is based lies in the narrow frequency bands associated with the semitones of the music scale, rather than in the continuum of audio frequencies or in other sets of discrete frequency bands. It is also based on the principle that the set of semitones that have energies above a threshold amount at each instance provide sufficient information for recognition, and that it is not necessary to use the absolute energies of all frequencies for recognition.

Thus, U.S. Pat. No. 5,437,050 provides an apparatus and a method of recognizing broadcast information, including the steps of receiving broadcast information, the broadcast information being in analog form and varying with time; converting the broadcast information into a frequency representation of the broadcast information; dividing the frequency representation into a plurality of separate frequency bands (generally 48 bands over four octaves); determining a magnitude of each separate frequency band of the digital sample; and storing the magnitudes. The method of recognizing broadcast information also includes the steps of performing a significance determination a plurality of times, the significance determination including the steps of generating a magnitude of each separate frequency band, using a predetermined number of previously stored magnitudes for each respective frequency band; storing the magnitudes; and determining a significance value, using a predetermined number of previously stored magnitudes for each respective frequency band. The method of recognizing broadcast information further includes the steps of comparing the significance value to the most recently generated magnitude of each separate frequency bands generating a data array, the data array having a number of elements equal to the number of separate frequency bands, the values of the elements being either binary 1 or binary 0 depending on the results of the comparison; reading a reference data array, the reference data array having been generated from reference information; comparing the data array to the reference data array; and determining, based on the comparison, whether the broadcast information is the same as the reference information.

U.S. Pat. No. 5,437,050 also provides a digital recording method in conjunction with the monitoring system to achieve recognition of broadcast information pre-specified to the monitoring system. The digital recording method can also achieve recognition of broadcast information not previously known to the monitoring system, while preserving a complete record of the entire broadcast period which can be used for further reconciliation and verification of the broadcast information.

More specifically, the method of recording broadcast information includes the steps of receiving a set of broadcast information; recording the set of broadcast information in a compressed, digital form; generating a representation of the set of broadcast information; comparing the representation to a file of representations; making a determination, based on the comparison, of whether the representation corresponds to any representations in the file; upon a determination that the representation corresponds to a representation in the file, recording the broadcast time, duration, and identification of the set of broadcast information that corresponds to the representation; upon a determination that the representation does not correspond to any representations in the file, performing the following steps: (a) performing a screening operation on the representation in order to discern whether the representation should be discarded; (b) upon a determination that the representation should not be discarded, performing the following steps: (c) playing the recorded set of broadcast information which corresponds to the set of broadcast information from which the representation was generated in the presence of a human operator; and (d) making a determination, based on the playing of the recorded set of broadcast information, of whether the representation should be added to the file of representations and whether a recording should be made of the broadcast time, duration, and identification of the set of broadcast information that corresponds to the representation.

As noted above, while the technology described in U.S. Pat. No. 5,437,050 has been widely used, over the years it has become apparent that it has some limitations. While working well in its intended application, attempts to apply it to other applications have met with varying degrees of success. The technology is not extremely effective at short-term matching; that is determining whether a match exists between the data produced by a short segment of source material and a previously stored reference. In general, relatively few bits are set; on average, only 3 bits in a 48 bit frame. Often, the same bits are set for many frames in a row. When a strong melody is not present, continuity may be weak. Further, in the presence of a strong melody, it is possible that only one bit will be set for many frames.

Slightly different results may be produced, in terms of the specific bits set for the same source material, when different amounts of audio compression are used. Further, different bits may be set when transients are suppressed.

SUMMARY

A method for reducing data in the form of successive groups of N values may comprise finding the largest X values of the N values of each group, setting all but the largest X values of each group equal to zero, averaging W respective ones of the N values to produce N average values, finding the largest Y of the N average values, where Y is less than X, and setting the largest Y of the N average values equal to a first binary value, and a reminder of the N average values equal to a second binary value.

DETAILED DESCRIPTION

It is an object of the invention to provide an apparatus and method for processing a signal so as to represent the characteristics of that signal in a compact form.

It is a further object of the invention to provide an apparatus and method for reducing data to a form that supports efficient processing of the data.

It is a further object of the invention to provide an apparatus and method for determining whether the signal contains particular content, and to do so in a computationally efficient manner.

It is yet another object of the invention to provide an article of manufacture containing a computer program which causes a computer to achieve the above mentioned objects.

The present invention may be thought of as a lossy data reduction technique. A series of input frames is each comprised of a set of N scalar values which may represent, for example, amplitude, magnitude or intensity of some characteristic of an original signal S. The nature of signal S, the choice of N characteristics, and the decomposition of signal S into input frames may take many different forms, and may be considered as independent of the invention. The input frames have a sampling rate Sr. The invention produces a series of output frames with a sampling rate of that of the input frames divided by W (that is Sr/W), where W is an averaging window, represented by a whole number greater than one, and wherein each output frame comprises N bits.

The invention transforms the input frames into a fewer number of output frames using the following method. Each input frame is analyzed, and the top X (where X is less than N) of the N characteristic values are identified. Values in the input frames not in the top X are set to zero. Subsequent input frames are processed in the same manner until W frames have been so processed, with their top values identified and values other than their top values set to zero. The respective processed values for each N in the W processed input frames are averaged, producing N average values. These average N values are analyzed, and the top Y values (where Y is less than X) are identified. An output frame is produced, including one bit for each N, wherein the bit is set to one if the value of the particular average was in the top Y, and the bit is set to zero if it was not in the top Y. Processing then continues for the next W input frames to produce the next output frame.

The resulting output has the following useful characteristics. First, it is a much smaller amount of data than the input. Specifically, the resulting size of the output data is 1/(Nbits*W) times the size of the input data, where Nbits is the number of bits used to represent each of the scalar N values. Typical values of Nbits and W are 32 and 5 respectively, yielding a 1:160 reduction.

In addition, the bits set to 1 in the output data tend to represent the most salient characteristics of the input signal during the time period covered by each output frame. Further, a constant number of bits, Y, is set in each frame, making the resulting data and its properties amenable to straightforward analysis. The resulting output is more robust, in the sense that it is less impacted by noise, transients, and distortions than a conventional averaging technique. The output data can be used in many of the applications that would require the input data. These applications include signal comparison, feature detection, pattern recognition, anomaly detection, trend analysis, and etc. A significant increase in processing speed is provided, due to the reduction in the amount of data that must be processed, and the fact that bit comparison operations can be used to process the data.

The invention has commercial application in the field of audio recognition, where the characteristics are amplitude measurements for semitones as determined by a smoothing sine/cosine filter bank, as described in the above referenced U.S. Pat. No. 5,437,050. In this application, N=48, Nbits=32, Sr=50 Hz, W=5, X=12 and Y=8. The resulting system, when compared to the system described in the patent, provides a five fold reduction in the volume of data that must be transmitted and processed, and a ten to twenty fold reduction in recognition processing time, with no loss in recognition accuracy. In this application, the invention operates on the principle that it is better to produce fewer frames having more information per frame. Thus, the frequencies having the largest magnitudes are processed, and others are suppressed.

In the broadcast recognition application, the method and apparatus divide the signal into a series of frames; for each frame, divide a spectrum of the signal into a series of frequency segments; determine which of a number of frequency segments of the series of frequency segments have the largest amplitudes; set a value of zero for all of the frequency segments other than the number having the largest amplitudes; set a value representative of amplitude for the frequency segments having the largest amplitudes, average respective values, for a series of frames, to produce a series of average values; select a number of the average values which are largest average values; and produce the digital representation by setting bits to a first binary value for the selected number of the average values, and to a second binary value for all other average values. The averaging of respective values, for a series of frames, to produce a series of average values includes averaging the values of zero.

The number of frequency segments of the series of frequency segments having the largest amplitudes in the spectrum of the frame may be a predetermined, fixed number. The number of the average values having the largest average values that are selected may also be a predetermined, fixed number. Preferably the first binary value is one and the second binary value is zero.

Determining which of a number of frequency segments of the series of frequency segments have the largest amplitudes in the spectrum of the frame comprises performing a Fourier transform on the signal. Preferably, a Discrete Fourier Transform is used. The method and apparatus perform further processing by comparing the digital representation to a set of predefined digital representations corresponding to known content; and using results of the comparison to determine whether the signal contains the known content. A reference library of digital reference representations of known content may be provided. In the broadcast application the signal may be an audio signal representative of music or of a song.

The invention is also directed to a method for determining the likelihood of a match between a first set of data having Y of N bits set equal to a first binary value and a remainder of the bits set equal to a second binary value, and a second set of data also having Y of N bits set equal to a first binary value and a remainder of the bits set equal to a second binary value. This method comprises determining the general probabilities of Y of N bits in the first set of data and in the second set of data being the same; and heuristically processing the probabilities to produce a series of match values based on the number of respective bits in the first set of data and in the second set of data that are identical. The heuristic processing may comprise assigning a match of n out of Y values a value of 1; normalizing remaining values to the value of 1 to produce resulting numbers; multiplying the resulting numbers by a constant to produce multiplied numbers; and subtracting the multiplied numbers from 1 to produce the match values. It may further comprise setting match values greater than a predetermined value to values substantially equal to 1.

Figure 1:
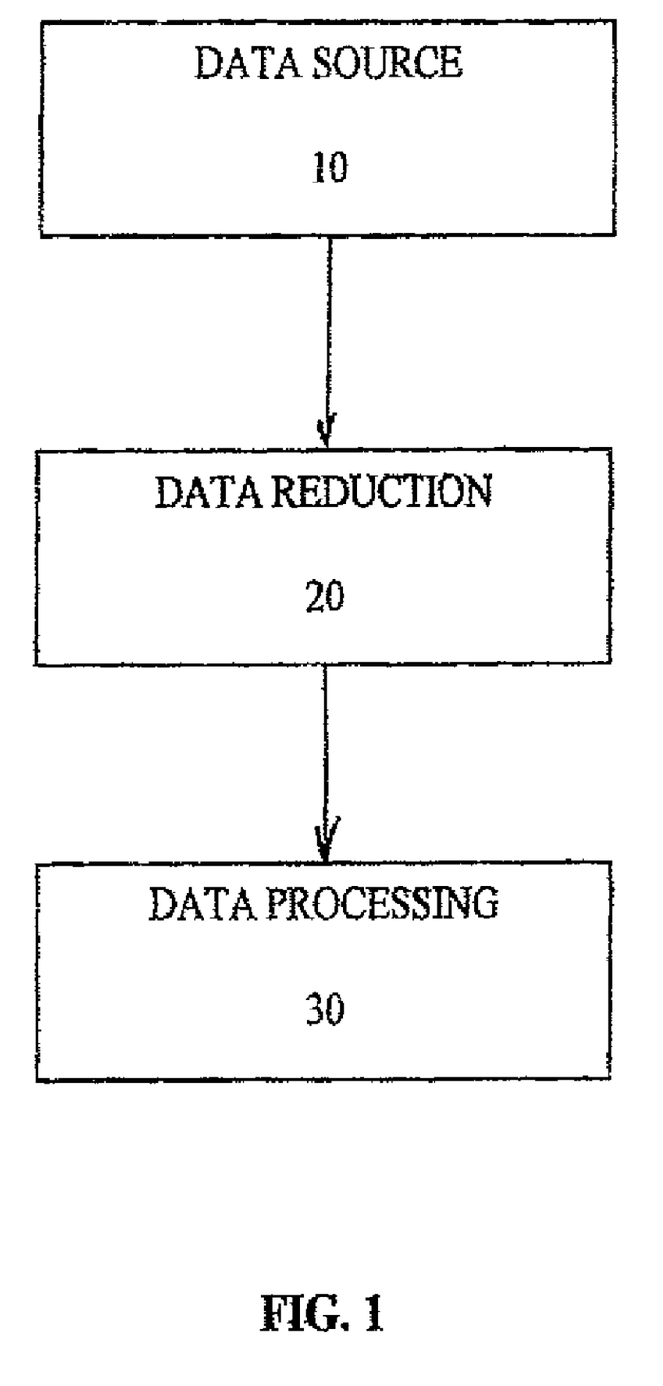
FIG. 1 is a general, high level block diagram showing the use of the invention in data processing.

Referring to FIG. 1, the present invention may be used in applications having a source of data 10. This source may be comprised of data acquisition components of a broadcast monitoring system of the type described in U.S. Pat. No. 5,437,050 (which is incorporated herein in its entirety), but is not in any way so limited. Although the present invention will be described principally with reference to this application, it should be understood that the present invention can be used in many other applications. For example, applications of the present invention include data reduction for the analysis and processing of any time-varying signal that can be decomposed into a finite number of characteristics. These applications include audio analysis where the characteristics are the output frequencies as determined by a discreet Fourier transform or a fast Fourier transform (as in the above mentioned application). Some of these applications include determining the characteristics of sound; whether is it soft or loud, music or voice, tonal characteristics such as the key in which music is played, or its tempo. Other applications include video analysis where the characteristics represent the intensities of certain spectral components, video analysis where the characteristics are signal intensity levels at certain screen locations, web site usage analysis where the characteristics are hit counts for certain pages, and traffic analysis where the characteristics are traffic volume measurements at certain intersections. The present invention may also be used for purposes of data reduction for general clustering analysis.

In FIG. 1, the data provided by data source 10 is processed by a data reduction block 20, in accordance with the invention. After processing by data reduction block 20, the reduced data is fed to a data processing block 30, where processing is performed to produce a desired result. For example, various data modeling techniques may be used. In the case of a broadcast content recognition system, the data may be processed in the manner similar, but not necessary identical, to the manner disclosed in U.S. Pat. No. 5,437,050, which again is used merely by way of example, and not by way of limitation. Various modeling techniques may be used during the process of analyzing the reduced data, including a "scoring algorithm" as described below.

Figure 2A:
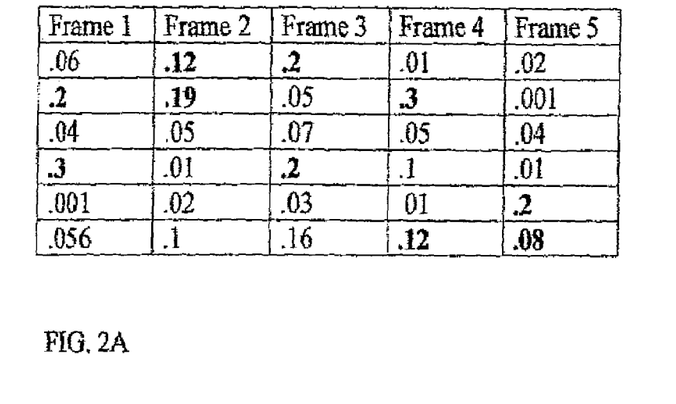
FIG. 2A, FIG. 2B and FIG. 2C are tables of data which illustrate the manner in which data reduction is performed, in accordance with the invention.
Figure 2B:
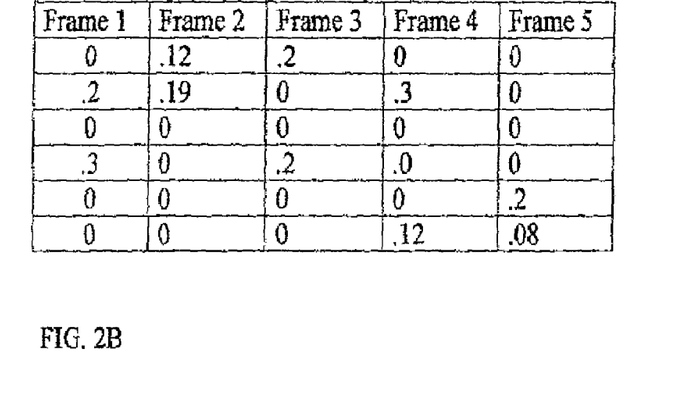
Figure 2C:
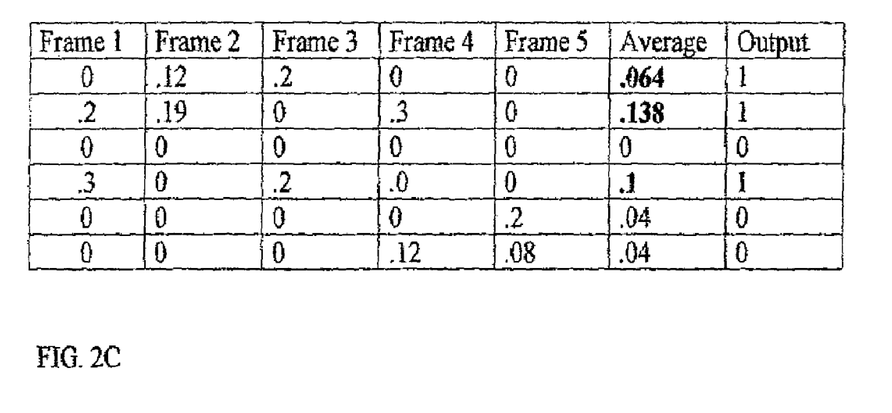

FIG. 2A, FIG. 2B and FIG. 2C illustrate the manner in which data is reduced in accordance with the invention. In FIG. 2A the amplitudes of five successive frames of data from a data source are illustrated in columns with headings Frame 1, Frame 2, Frame 3, Frame 4 and Frame 5. Each frame has six distinct values, as represented by the six rows of data. In actual practice, there may be many more rows for each frame, and many more frames could be processed simultaneously. For example, if the invention is used in the context of broadcast signal content recognition in accordance with U.S. Pat. No. 5,437,050, then each frame would have 48 values, and thus there would be 48 rows of data. Each value would be representative of the actual amplitude of a particular frequency within the four selected octaves of the musical scale as provided by the data source.

For each frame of FIG. 2A, the top X values are selected. In FIG. 2A, X=2. These values are represented by bold faced type.

Referring to FIG. 2B, all values other than those selected in FIG. 2A are set equal to zero. The selected values are not changed, and remain as such in the matrix.

Referring to FIG. 2C, in a sixth column, the average value for each row is calculated, with the values set to zero averaged in as such. Then the Y largest average values are selected. In this example Y=3, so that the largest three values are shown in bold-faced type. An Output is produced (column at the right) wherein the bit value for the selected Y largest values is set equal to binary 1. The remainder of the bit values are set equal to binary 0. The data reduction has been completed, with Y of the original values set to binary 1. Thus, as discussed in more detail below, the number of bits having a binary 1 value in the output of the data reduction process is constant, regardless of the precise nature of the data provided by the data source 10 (FIG. 1).

Figure 3:
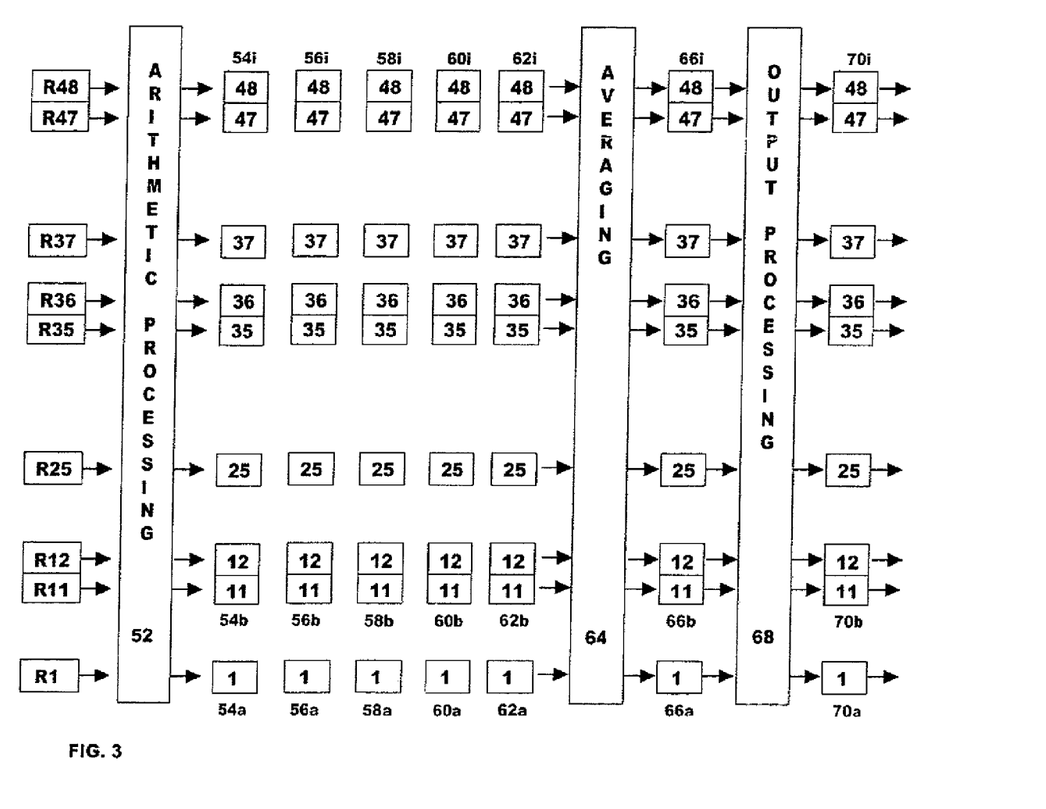
FIG. 3 is a block diagram of a representation of the manner in which data may be processed, in accordance with the flow chart of FIG. 4.

As noted above, source data may be derived from various sources. In the broadcast industry, source data may be program content. Reference is made to the detailed description of the operation of FIG. 1 and FIG. 2 in U.S. Pat. No. 5,437,050, which, is incorporated by reference herein. By way of example only, the outputs produced by apparatus such as the forty eight notch filters of FIG. 2 of U.S. Pat. No. 5,437,050 may be processed as illustrated in FIG. 3 herein and in accordance with method steps of FIG. 4 herein. Although implemented in software, it will be recognized by those skilled in the art that all functions illustrated therein may also be performed by an appropriately designed hardware, although generally at much greater cost. The invention may be implemented in software, using any general purpose programming language.

Figure 4:
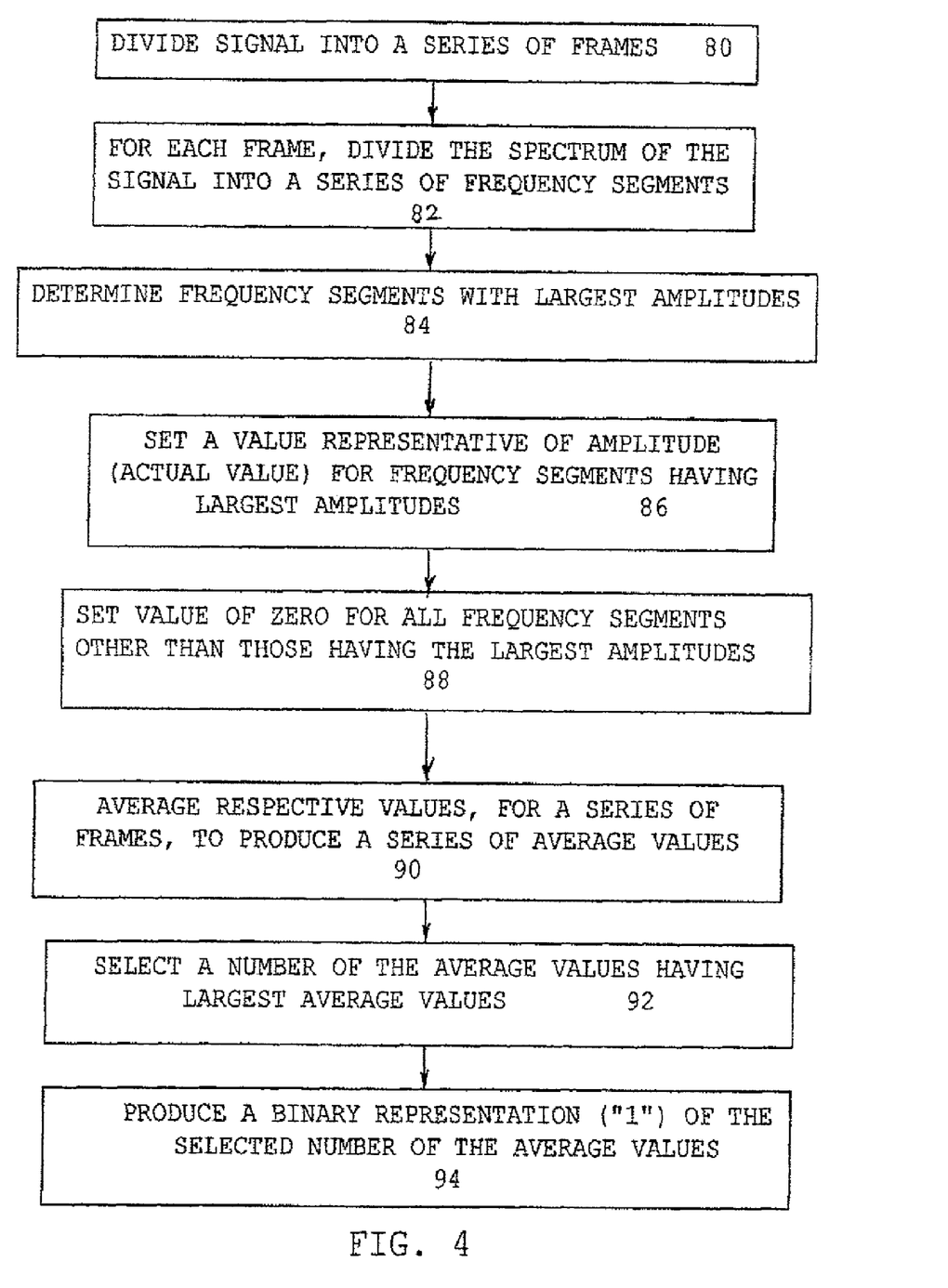
FIG. 4 is a flow chart of the method of processing data in accordance with the invention.

Referring to FIG. 3 and to FIG. 4 herein, the values produce by the forty eight notch filters 130a to 130i (FIG. 2 of U.S. Pat. No. 5,437,050) for successive frames (steps 80 and 82 of FIG. 4 herein) are stored in a series of respective registers R1 to R48. Just as there are forty eight notch filters, there are forty eight registers. The values stored in these registers are inspected by an arithmetic processing routine 52, and by successive comparison, or other techniques, such as for example, ranking of magnitudes in order, a determination is made as to which of the forty eight values are highest. A fixed, predetermined number of highest values are selected (step 84 of FIG. 4). For example, in accordance with a preferred embodiment of the invention, it has been found useful to determine which of registers R1 to R48 have the twelve highest values.

The twelve highest values selected by arithmetic processing routine 52 are transfers to respective registers 54a to 54i (there are also forty eight of these registers). This is represented in step 86 of FIG. 4. All other registers of registers 54a to 54i are loaded with or retain a value of zero (step 88 of FIG. 4). The steps described above are repeated for the next frame of the source material, and the contents are stored in registers 56a to 56i. At this point, registers 54a to 54i have contents as described above, representative of a first frame of the source signal, while registers 56a to 56i have contents representative of the second frame. This process is repeated for three additional frames, for a total of five frames, and the contents are successively stored in registers 58a to 58i, registers 60a to 60i, and registers 62a to 62i, until these buffers have contents, as described above, representative of five successive frames of the signal.

When the registers have been filled as described above, an arithmetic averaging routine, represented as 64, will average the contents of all of the registers 54, 56, 58, 60 and 62 along a row of registers in FIG. 3 (step 90 in FIG. 4). The contents are then placed in respective registers 66a to 66i. In other words, register 66a contains the average value of registers 54a, 56a, 58a, 60a and 62a. Register 66b contains the average value of registers 54b, 56b, 58b, 60b and 62b. Similar statements may be made for the remaining ones of the forty eight registers as represented by 66c through 66i.

The values stored in registers 66a to 66i are processed by an output processing routine 68. Output processing routine 68 is similar to arithmetic processing routine 52 in that it is designed to determine the highest values of the averages stored in registers 66a to 66i (step 92 in FIG. 4). For example, in accordance with a preferred embodiment of the invention, it has been found useful to determine which of registers 66a through 66i have the highest eight values. These eight values are represented by a binary value of "1" in respective registers 70a to 70i. The remaining one of registers 70a to 70i remain or are set to a value of binary "0". The processing by output processing routine 68 is represented by step 94 in FIG. 4.

It is noted that near silent frames may be represented by a predetermined unusual and unique 48-bit value with eight bits set in an inharmonic pattern extremely unlikely to occur in source material. The value [100000100001 000001000001000001000001000001000000000] is exemplary. Given a root frequency of B, this would yield the following musical notes: B-F-Bb-E-A-Eb-Ab-D. This is just one of many possible heuristic values. This value represents two chromatic clusters (D,Eb,E,F and Ab,A,Bb,B) distributed to form four tritones (B/F, Bb/E, A/Eb, Ab/D) and six major seventh (B/Bb, F/E, Bb/A, E/Eb, A/Ab, Eb/D) intervals. The clusters and intervals are dissonant in and of themselves, and it is extremely unlikely that they would occur together in music.

It is also noted that the highest twelve and eight values are represented as floating point numbers, and a tie as to which frequency is of highest amplitude is unlikely. However, if a tie does occur, then either the higher represented frequency of the forty eight frequencies or the lower represented frequency is designated as the higher twelfth or eighth value. It is not critical as to whether it is the higher or lower of the two frequencies that is represented, as long as this is done on a consistent basis. After five frames of the signal have been processed as described above, all registers of FIG. 3 may be cleared (reset to have values of zero) and the entire process is repeated for the next five frames. Alternatively, the values are simply written over during processing of the next five frames.

The result of the processing described above is a representation of five successive frames of signal, wherein no matter what the nature of the signal, a fixed, predetermined number of bits (eight bits in the exemplary embodiment) of the total (forty eight in the exemplary embodiment) are always set to "1". Having a constant number of bits per frame set to a particular binary value has marked advantages. First, there is constant information density provided at the output of the data reduction process.

Another advantage is that the probability of having N bits match in any particular frame, when a processed signal is compared to a reference, can be pre-calculated in a fairly precise way. Yet another advantage is that the number of bits representative of any source material is always directly related to the number of frames (8 in the preferred embodiment), and thus does not need to be calculated by, for example, the sum of bit count lookups.

Thus, in the example described above, an array of 48 bits is produced every five frames (every one tenth of a second). A series of successive arrays may compared to data in a reference library to determine whether known program content is present in a broadcast signal being monitored, as for example in U.S. Pat. No. 5,437,050.

Utilizing the Reduced Data—Scoring Algorithm

In accordance with the present invention, a determination as to whether there is a match between source data and data in a reference library may be based on the following analysis. In other words, successive frames of the reduced data and a reference are compared. The basis for the comparison is explained below.

Figure 5:
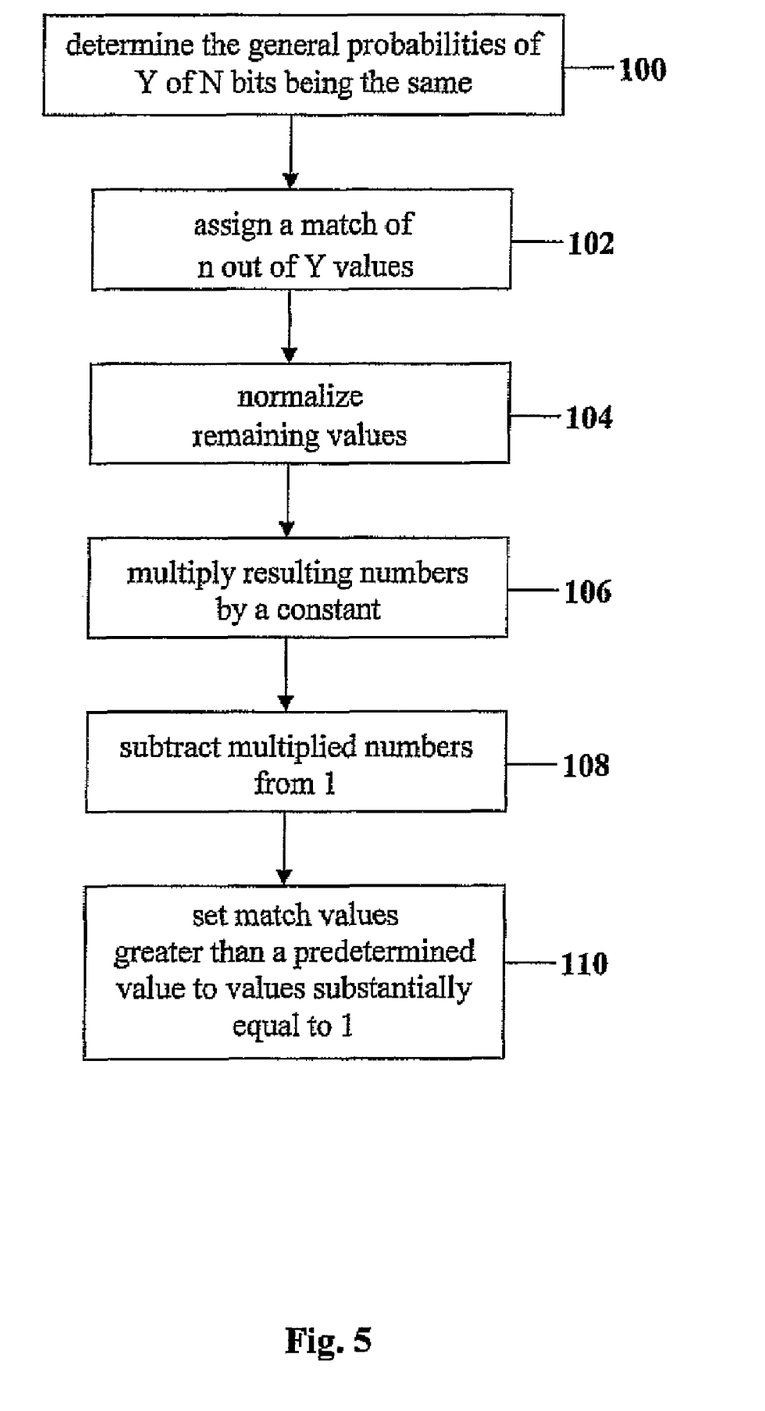
FIG. 5 is a flow chart of an exemplary method of utilizing processed data in accordance with various embodiments of the present invention.

FIG. 5 illustrates determining the general probabilities of Y of N bits being the same in various embodiments of the present invention, as indicated at step 100. The probability of having n bits match in any frame is: 1(8 n)(40 8−n)(48 8)

This allows for the computationally efficient assignment of a non-linear match value per frame, thus yielding an excellent curve fitting metric. The bits matched count of a frame (always in the range of zero to eight) is used to look up a match value, rather than to perform a more computationally intensive match calculation as in U.S. Pat. No. 5,437,050.

FIG. 5 illustrates heuristically processing the general probabilities in an embodiment of the present invention, as indicated at steps 102, 104, 106, 108, and 110. Match values are assigned heuristically with deference to and consideration of the probabilities of random data having that many bits match. As indicated in step 102, n out of Y values may be selected. The raw probabilities, calculated as in the equation above, for n out of eight bits matching are {0.2038, 0.39, 0.284, 0.097, 0.017, 0.0014, 0.000058, 0.00000085, 0.0000000027}. The sum of these probabilities, if taken to the limit of accuracy, totals 1. A match of six out of eight may be taken as a baseline of a probability of 1.0 as indicated at 104. The values then become: 1-6,500, 2-4,733, 3-1,616, 4-283, 5-23, 6-1, 7, 8-better than 1

Referring still to FIG. 5, the square roots of the resulting numbers are taken, they are multiplied by 10 or any other constant as indicated at step 106, and subtracted from 1.000 as indicated at step 108. As indicated at step 100, the values for seven and eight are simply assigned as 0.999 and 1.000, respectively, so that a value greater than 0.990 (the value for n=6) is produced. However, this is a heuristic construct, as there is insufficient scale for representing how much better a match with seven or eight bits (as compared to a match with six bits) really is.

The resulting table of match values based on the number of bits that are the same, over the range of zero through eight bits, is: [0060] (0, 0.194, 0.312, 0.589, 0.832, 0.952, 0.990, 0.999, 1.000).

The match values may be summed and averaged over the comparison run length of the sample and the reference in the reference library to yield the score.

The score for k frames for any two sets of data A and B may be computed as: 2 Score=i=0 k−1 matchValue (bits Matched (Ai, Bi))k For purposes of discussion, as an example, a small sample of reduced data, produced in accordance with the invention, is used. If in one second, there are ten frames of reduced sample data to match to ten frames of reference data, a table of number of matched bits and corresponding match values, in accordance with the criteria set forth above is represented as: 2 Number of Bits Matched Match values 6 0.99 7 0.999 5 0.952 3 0.598 5 0.952 2 0.312 4 0.832 3 0.598 6 0.99 5 0.952 Total 8.175 Score (=average) 0.8175

Depending on the application, the score of 0.8175 may indicate that there is a match between the sample and the reference data. Thus, it has been found that the present invention provides excellent short-term discrimination, with highly separable scores between matches and non-matches. Further, when the phase of the sample signal is shifted with respect to the reference, performance remains excellent, showing that matching is not phase sensitive. Finally, less data must be processed than in prior art systems, and thus computational efficiency is greatly enhanced.

If a determination has been made that a match is unlikely, then it is assumed that the program content is not in the reference library. Program content that is not in the reference library may be evaluated in the manner described in U.S. Pat. No. 5,437,050 to determine which parts of the program content is a "suspect" and to allow a human operator to determine which suspects represent content that should be added to the reference library.

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

The present invention can be realized in hardware, software, or a combination of hardware and software. Any kind of computer system, or other apparatus adapted for carrying out the methods and/or functions described herein, is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which, when loaded in a computer system, is able to carry out these methods. Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to effect one or more functions of this invention. Furthermore, the present invention may be implemented as a program storage device readable by machine, tangibly embodying a program of instructions executable by the machine to perform method steps for causing one or more functions of this invention.

Figure 6:
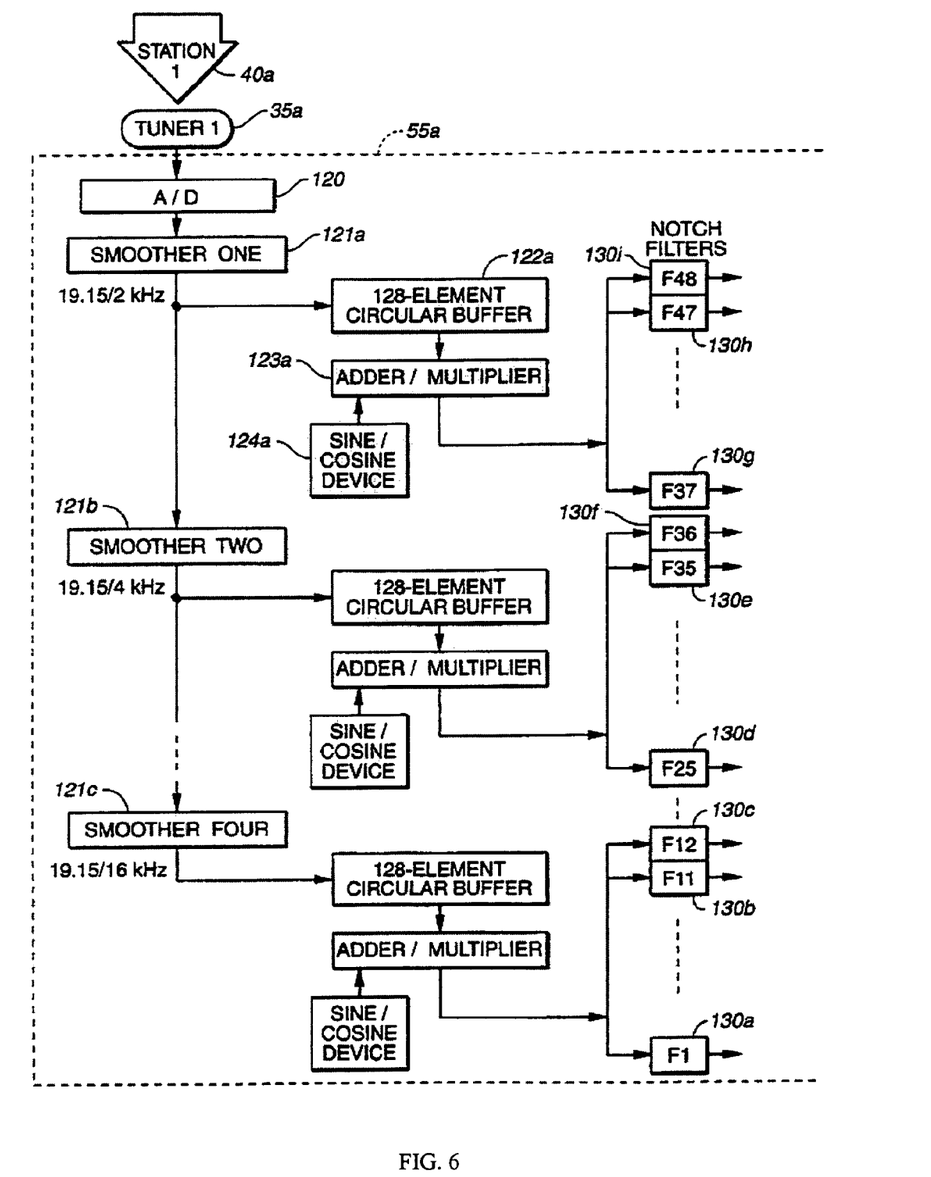
FIG. 6 is a block diagram corresponding to FIG. 2 of U.S. Pat. No. 5,427,050, which is elsewhere incorporated herein by reference.

With reference now to if FIG. 6, which corresponds to FIG. 2 of U.S. Pat. No. 5,427,050, which is elsewhere incorporated by reference. FIG. 6 provides exemplary illustrations of apparatus components corresponding to steps 80 and 82 of FIG. 4 herein, as referred to in the description of FIG. 4 above. Looking at FIG. 6, activity recorder 55a is shown having an analogue-to-digital converter 120, which converts input audio signal 40a into digital samples. In the preferred embodiment, the audio signal 40a is converted from its analogue form into digital samples by the analogue-to-digital converter 120 at a rate of 19,150 samples per second. The four smoothers of activity recorder 55a are represented by the first, second, and fourth smoothers depicted in FIG. 6 as 121a-c. The exemplary activity recorder 55a further comprises 48 notch filters. The 48 notch filters split a processed audio signal into 48 separate frequency bands. The 48 notch filters are represented by the first, eleventh, twelfth, twenty-fifth, thirty-fifth, thirty-sixth, thirty-seventh, forty-seventh, and forty-eighth notch filters depicted in FIG. 6 as 130a-i, respectively. Each of the 48 notch filters is tuned to one of the 48 semitones in a 4-octave frequency interval. A semitone is any one of the discrete audio frequencies of the even-tempered music scale. There are 12 semitones per octave with the reference semitone at 440 Hz, which is middle A on the piano. Each of the 48 notch filters passes only the frequency components of the processed audio signal that are within a narrow frequency interval centered at the frequency of which the notch filter is tuned. A graph of the frequency response of the combined 48 notch filters resembles the teeth of a comb, hence the name. The 48 notch filters are implemented using a combination of digital and mathematical techniques, as is known in the art. Each of the 48 notch filters has a bandwidth limit that is tight enough to resolve an individual semitone. For example, the notch filter that detects A-natural passes virtually nothing if tones at either A-flat or A-sharp are input to the notch filter. In the preferred embodiment, the 4-octave interval is set with the upper semitone at approximately 2 kHz and the lower semitone at approximately $\tfrac{2}{16}$ kHz.

Looking at the four smoothers 121a-c of FIG. 6, each of the four smoothers takes as input a stream of digital data, say D0. Consider any 4 successive data values d1, d2, d3, and d4 in the D0 data stream. The smoother's output value corresponding to d4 is the average of d1, d2, d3, and d4. In other words, for each value dn in the input data stream D0 there is a value in the output data stream that is the average of dn and the 3 D0 values that immediately proceeded it.

The 4-value averaging operation attenuates frequency components in D0 higher than one-half the D0 data rate frequency. In effect, the smoother stripe away information about the highest frequency components of the input signal D0, and it passes on information about the low frequency components of D0 in its output, say D1. As a consequence, the temporal variations in the D1 data stream are slower than those in D0 and hence there is a degree of redundancy in any two successive D1 data values.

In the embodiment of FIG. 6, the input to each smoother is the output of the smoother before it. The input data stream for the first smoother is the output of the analogue-to-digital converter 120, which is generating data at the rate of 19.15 kHz. The output of the first smoother 121a contains frequency components covering the entire 4-octave analysis window and is fed to the 12 notch filters 130g-i that extract the 12 semitones in the highest of the 4 octaves. Every other output value from smoother one 121a is fed as input to smoother two 121b. Thus, the data rate into smoother two 121b is kHz. Smoother two 121b essentially removes audio frequencies in and above the highest of the four octaves of interest, but leaves frequencies in the third and lower octaves unaffected. Therefore, the output of smoother two 121b is fed to the 12 notch filters 130d-f that extract the semitones in the next to highest octave, i.e., octave three. Note that these filters 130d-f are processed only one-half as often as those 130g-i in the highest octave.

Following this logic the output of smoother two 121b is fed to smoother three (not shown) at a rate of samples per sec, and the output of smoother three is used to quantify the second octave. Similarly, smoother four 121c provides the lowest octave. The efficiency of this multi-octave analyzer is evident in the rule that is used to control the processing operations. Rather than process every one of the smoothers and 48 notch filters each time a value is generated by the analogue-to-digital converter 120, only two smoothers and 12 notch filters are processed each time the analogue-to-digital converter 120 produces a new value. The particular smoothers and notch filters that are processed on each data cycle are specified by the following algorithm:

Let N denote the data cycle number. N is equivalent to the total number of A/D values generated up to and including the present data cycle. Then, (1) For all data cycles, i.e., for all N, process smoother one 121a.

(2) For each data cycle process one additional smoother and 12 notch filters according to the following rule. If (2a) bit 0 (the least significant bit) of N is 1, process smoother two 121b and notch filters 130g-i (F37 through F48). Processing for this cycle is then complete. Else if (2b) bit 0 of N is 0 and bit 1 of N is 1, process smoother two 121b and notch filters 130d-f (F25 through F36). Processing for this cycle is then complete. Else if (2c) bit 0 of N is 0 and bit 1 of N is 0 and bit 2 of N is 1, process smoother three and notch filters F13 through F24 (not shown). Processing for this cycle is then complete. Else if (2d) bit 0 of N is 0 and bit 1 of N is 0 and bit 2 of N is 0 and bit 3 of N is 1, process smoother four 121c and notch filters 130a-c (F1 through F12). Processing for this cycle is then complete. Else if (2e) none of the above conditions is satisfied, i.e., if bits 0,1, 2, and 3 of N are all zero, no processing is required on this cycle (other than that of smoother one 121a in step 2).

Data from each smoother is first processed before it is sent to a corresponding set of 12 notch filters. Looking at the output of smoother one 121a, for example, the output is routed to a circular buffer 122a. After circular buffer 122a receives a first data sample from smoother one 121a, the first data sample is placed in slot 1 of the circular buffer; the second data sample goes into slot 2; and the 128th data sample is placed in slot 128. The 129th sample is placed in slot 1, overwriting sample 1; sample 130 is placed in slot 2, overwriting sample 2; etc. Thus, the circular buffer always contains the last 128 samples, but no earlier ones, regardless of the number of samples that have been generated.

Considering notch filters F37 through F48 shown in FIG. 6 at 130g-i, output from smoother one 121a is fed into circular buffer 122a at the rate of 19.15/2 kHz. (Note that only one circular buffer serves the 12 notch filters in each of the 4 octaves.) The 128 elements of circular buffer 122a are then Discrete Fourier Transformed using adder/multiplier 123a and sine/cosine device 124a. A Discrete Fourier Transformation is performed at every "tick" (every $\tfrac{1}{50}$ th of a second). The Discrete Fourier Transformation process is known in the art and, in the preferred embodiment, involves multiplying all values in the circular buffer by sine and cosine functions and adding the products to obtain the magnitude of the output.

Since circular buffer 122a holds the last 128 samples, the time period spanned by the circular buffer data is 128*2/19150=0.0134 sec. Thus, at each tick when the notch filter outputs are computed, the outputs of filters 130g-i (F37 through F48) represent average values over the last 0.0134 seconds. Similarly, the outputs of F25 through F36 represent averages over a period twice this long; F13 through F24 represent averages over four times this period; and F1 through F12 represent averages over 8*0.0134=0.107 sec.

It is noted that the foregoing has outlined some of the more pertinent objects and embodiments of the present invention. The concepts of this invention may be used for many applications, as discussed above. Thus, although the description is made for particular arrangements and methods for exemplary purposes, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments have been provided as an example and not as a limitation. The scope of the invention is defined by the appended claims.

What is claimed is:

1. A method for providing a digital representation of a signal, comprising:
   receiving a signal;
   dividing the received signal into a series of frames;
   for each frame, dividing a spectrum of the received signal into a series of frequency segments;
   determining which of a number of frequency segments of said series of frequency segments have largest amplitudes in said spectrum of said frame;
   setting a value of zero for all of said frequency segments other than the number having the largest amplitudes;
   using a representative value for said frequency segments having the largest amplitudes,
      wherein each said representative value is representative of amplitude associated with the respective frequency segment;
   averaging respective values, for a series of frames, to produce a series of average values;
   selecting a number of the average values which are largest average values; and
   producing said digital representation by setting bits to a first binary value for said selected number of the average values, and setting bits set to a second binary value for all other average values, wherein the digital representation is used for a more efficient analysis of the signal.

2. The method of claim 1, wherein the number of frequency segments of said series of frequency segments having largest amplitudes in said spectrum of said frame is predetermined.

3. The method of claim 1, wherein the number of the average values having largest average values that are selected is a predetermined number.

4. The method of claim 1, wherein the number of the average values having largest average values that are selected is a predetermined number.

5. The method of claim 1, wherein the number of the average values having largest average values that are selected is a predetermined fixed number.

6. The method of claim 1, wherein:
   the number of frequency segments of said series of frequency segments having largest amplitudes in said spectrum of said frame is predetermined; and
   the number of the average values having largest average values that are selected is a predetermined number.

7. The method of claim 1, wherein:
   averaging is performed on data from five frames;
   the spectrum is divided into forty eight frequency segments;
   a value representative of amplitude is used for twelve of the frequency segments having the largest amplitudes; and
   the number of average values selected is eight.

8. The method of claim 1, wherein said first binary value is one and said second binary value is zero.

9. The method of claim 1, wherein determining which of a number of frequency segments of said series of frequency segments have largest amplitudes in said spectrum of said frame comprises performing a Fourier transform on the signal.

10. The method of claim 9, wherein said transform is a Discrete Fourier Transform.

11. The method of claim 1, wherein, averaging respective values, for a series of frames, to produce a series of average values includes averaging the values of zero.

12. The method of claim 1, further comprising:
   comparing said digital representation to a set of predefined digital representations corresponding to known content; and
   using results, of said comparison to determine whether the signal contains said known content.

13. The method of claim 12, wherein, said signal is a broadcast signal, and said content comprises a series of broadcast items.

14. The method of claim 12, wherein said signal is an audio signal.

15. The method of claim 12, wherein said signal is representative of music.

16. The method of claim 12, wherein said signal is representative of a song.

17. The method of claim 1, wherein said signal is an audio signal.

18. The method of claim 1, further comprising:
   providing a reference library of digital reference representations;
   comparing the digital representation of said signal to said reference representations in said library; and
   determining whether said representation of said signal matches one of said digital representations in said reference library.

19. An apparatus for processing a signal, comprising:
   a divider which divides the signal into a series of frames;
   an arrangement for dividing the spectrum of the signal into a series of frequency segments;
   a processor for determining which of a number of frequency segments of said series of frequency segments have largest amplitudes in said spectrum of said frame;
   a first value setter for setting a value of zero for all of said frequency segments other than the number having the largest amplitudes;
   a second value setter for setting a representative value for said frequency segments having the largest amplitudes, wherein each said representative value is representative of amplitude associated with the respective frequency,
   an average arrangement for averaging respective values, for a series of frames, to produce a series of average values;

a selector for selecting a number of the average values which are largest average values; and a binary value generator for producing a digital representation by setting bits to a first binary value for said selected number of the average values, and for setting bits to a second binary value for all other average values.

20. The apparatus of claim 19, wherein the number of frequency segments of said series of frequency segments having largest amplitudes in said spectrum of said frame is a predetermined number.

21. The apparatus of claim 19, wherein the number of frequency segments of said series of frequency segments having largest amplitudes in said spectrum of said frame is a predetermined fixed number.

22. The apparatus of claim 19, wherein the number of the average values having largest average values that are selected is a predetermined number.

23. The apparatus of claim 19, wherein the number of the average values having largest average values that are selected is a predetermined fixed number.

24. The apparatus of claim 19, wherein:
the number of frequency segments of said series of frequency segments having largest amplitudes in said spectrum of said frame is a predetermined number; and
the number of the average values having largest average values that are selected is a predetermined number.

25. The apparatus of claim 19, wherein:
the averaging is performed on data from five frames;
the spectrum is divided into forty eight frequency segments;
a value representative of amplitude is set for twelve of the frequency segments having the largest amplitudes; and
the number of average values selected is eight.

26. The apparatus of claim 19, wherein said first binary value is one and said second binary value is zero.

27. The apparatus of claim 19, further comprising:
apparatus for performing a Fourier transform on the signal to determine which of a number of frequency segments of said series of frequency segments have largest amplitudes.

28. The apparatus of claim 27, wherein said Fourier transform is a Discrete Fourier Transform.

29. The apparatus of claim 19, wherein said averaging arrangement averages the values of zero when producing a series of average values.

30. The apparatus of claim 19, further comprising:
a comparator for comparing said digital representation to a set of predefined digital representations corresponding to known content, to determine whether the signal includes said known content.

31. The apparatus of claim 30, configured to process a broadcast signal, and wherein said content comprises a series of broadcast items.

32. The apparatus of claim 30, configured to process an audio signal.

33. The apparatus of claim 32, configured to process a signal representative of music.

34. The apparatus of claim 30, configured to process a signal representative of a song.

35. The apparatus of claim 19, wherein said signal is an audio signal.

36. The apparatus of claim 19, further comprising:
a reference library of reference digital representations; and
a comparator for comparing the digital representation of said signal to said representations in said library to determine whether said digital representation of said signal matches one of said reference digital representations in said reference library.

37. An article of manufacture comprising a computer usable medium having computer readable program code embodied therein for causing a computer to provide a digital representation of a signal, by a method comprising:
dividing the signal into a series of frames;
for each frame, dividing a spectrum of the signal into a series of frequency segments;
determining which of a number of frequency segments of said series of frequency segments have largest amplitudes in said spectrum of said frame;
setting a value of zero for all of said frequency segments other than the number having the largest amplitudes;
using a representative value for said frequency segments having the largest amplitudes;
wherein each said representative value is representative of amplitude associated with the respective frequency segment;
averaging respective values, for a series of frames, to produce a series of average values;
selecting a number of the average values which are largest average values; and
producing said digital representation by setting its to a first binary value for said selected number of the average values, and setting bits to a second binary value for all other average values, wherein the digital representation is used for a more efficient analysis of the signal.

38. The article of manufacture of claim 37, wherein, in the method, the number of frequency segments of said series of frequency segments having largest amplitudes in said spectrum of said frame is predetermined.

39. The article of manufacture of claim 37, wherein, in the method, the number of frequency segments of said series of frequency segments having largest amplitudes in said spectrum of said frame is a predetermined fixed number.

40. The article of manufacture of claim 37, wherein, in the method, the number of the average values having largest average values that are selected is a predetermined number.

41. The article of manufacture of claim 37, wherein, in the method, the number of the average values having largest average values that are selected is a predetermined fixed number.

42. The article of manufacture of claim 37, wherein, in the method:
the number of frequency segments of said series of frequency segments having largest amplitudes in said spectrum of said frame is predetermined; and
the number of the average values having largest average values that are selected is a predetermined number.

43. The article of manufacture of claim 37, wherein, in the method:
averaging is performed on data frown, five frames;
the spectrum is divided into forty eight frequency segments;
a value representative of amplitude is set for twelve of the frequency segments having the largest amplitudes; and
the number of average values selected is eight.

44. The article of manufacture of claim 37, wherein, in the method, said first binary value is one and said second binary value is zero.

45. The article of manufacture of claim 37, wherein, in the method, determining which of a number of frequency segments of said series of frequency segments have largest amplitudes in said spectrum of said frame comprises performing a Fourier transform on the signal.

46. The article of manufacture of claim 45, wherein, in the method, said transform is a Discrete Fourier Transform.

47. The article of manufacture of claim 37, wherein, in the method, averaging respective values, for a series of frames, to produce a series of average values includes averaging the values of zero.

48. The article of manufacture of claim 37, wherein the method further comprises:
- comparing said digital representation to a set of predefined digital representations corresponding to known content; and
- using results of said comparison to determine whether the signal contains said known content.

49. The article of manufacture of claim 48, wherein, in the method, said signal is a broadcast signal, and said content comprises a series of broadcast items.

50. The article of manufacture of claim 48, wherein, in the method, said signal is an audio signal.

51. The article of manufacture of claim 50, wherein, in the method, said signal is representative of music.

52. The article of manufacture of claim 50, wherein, in the method, said signal is representative of a song.

53. The article of manufacture of claim 37, wherein, in the method, said signal is an audio signal.

* * * * *